Figure 1:
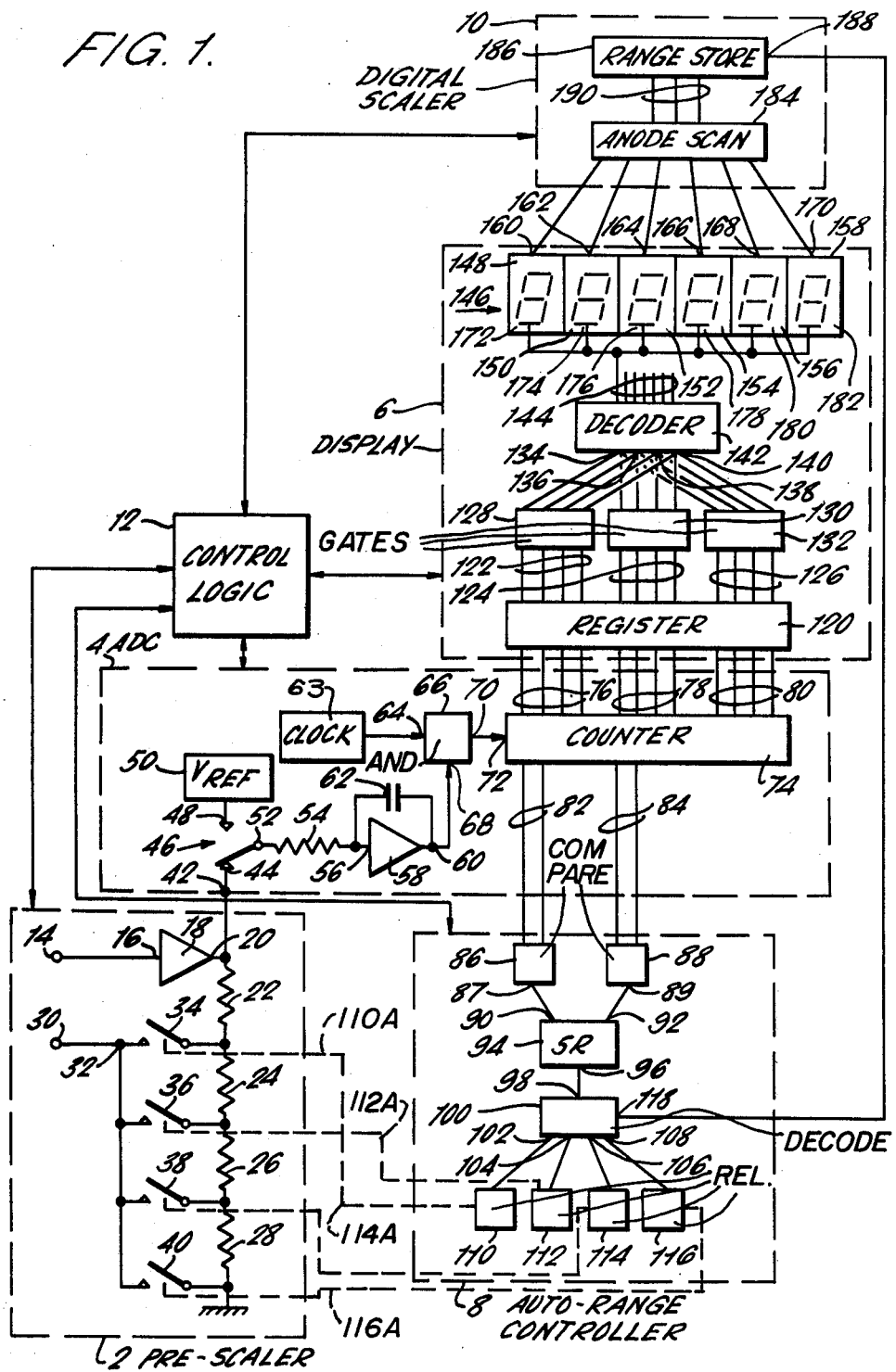

United States Patent [19]

Cook et al.

[11] 4,114,094
[45] Sep. 12, 1978

[54] LONG SCALE DISPLAY

[75] Inventors: John Gerald Cook, Farnborough; Julian David Shaw, Crowthorne, both of England

[73] Assignee: The Solartron Electronic Group Ltd., Farnborough, England

[21] Appl. No.: 611,037

[22] Filed: Sep. 8, 1975

[30] Foreign Application Priority Data

Sep. 20, 1974 [GB] United Kingdom ............... 41008/74

[51] Int. Cl.$^2$ ...................... G01R 15/08; G01R 17/06
[52] U.S. Cl. .................................. 324/115; 324/99 D
[58] Field of Search ................... 324/1, 5, 132, 99 D, 324/99 R

[56] References Cited

U.S. PATENT DOCUMENTS

| | | | |
|---|---|---|---|
| 2,889,518 | 6/1959 | Hudson et al. | 324/115 |
| 2,993,157 | 7/1961 | Bradley, Jr. | 324/115 |
| 3,237,102 | 2/1966 | Newell | 324/115 |
| 3,974,444 | 8/1976 | Whitaker | 324/115 |

OTHER PUBLICATIONS

Whitaker, R. O., "Is the Arabic-Decimal. . . ;" EDN; Feb. 5, 1974, pp. 86–92.

Primary Examiner—Rudolph V. Rolinec
Assistant Examiner—Ernest F. Karlsen
Attorney, Agent, or Firm—William R. Sherman; Kevin McMahon; Edward Manzo

[57] ABSTRACT

A digital voltmeter for measuring an input voltage which can lie in any one of M successive ranges comprises an input scaling device which scales the input voltage to produce a voltage lying in a single predetermined range, and which also produces a range signal indicative of the range in which the input voltage lies. An analogue-to-digital conversion circuit then converts the scaled voltage to a corresponding digital signal which has up to N significant decade figures of resolution, where N<M. The voltmeter has a display unit with M decades, each of which represents a fixed order of magnitude of the input voltage, and control means responsive to the range signal to direct the digital signal to the group of N adjacent decades of the display means appropriate to the magnitude of the input voltage.

7 Claims, 4 Drawing Figures

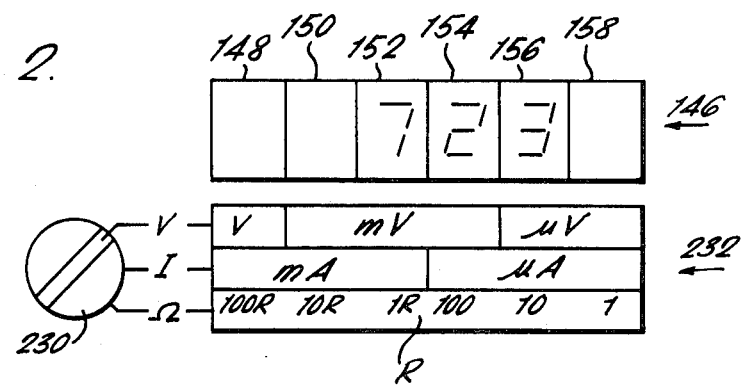
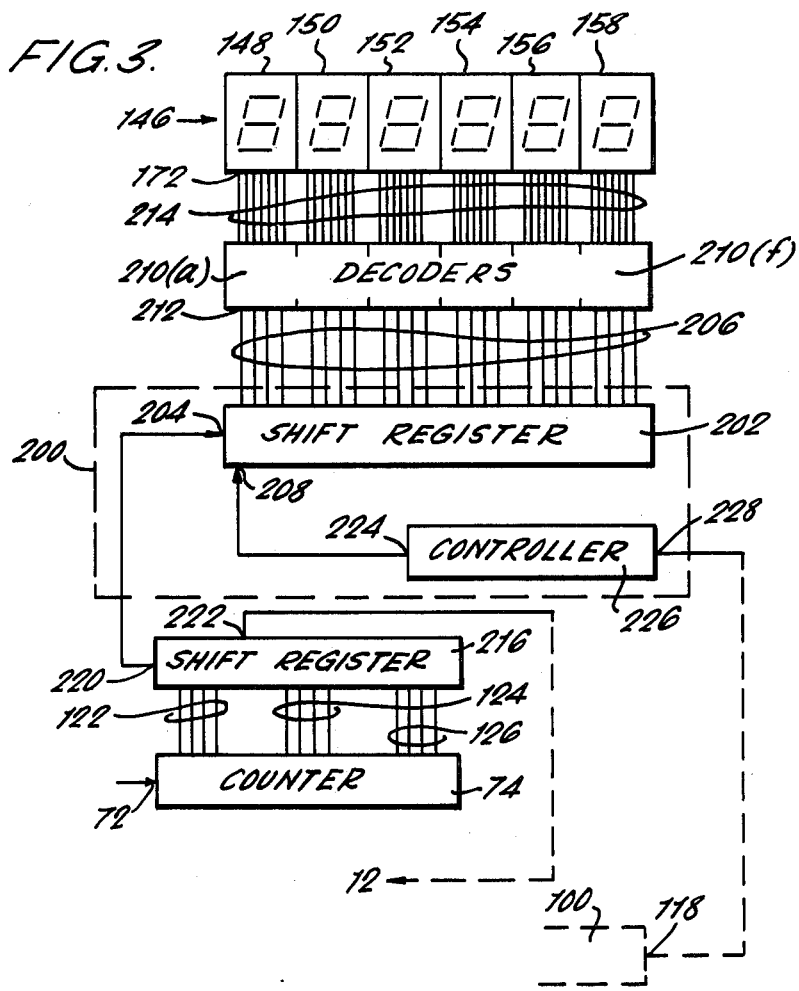

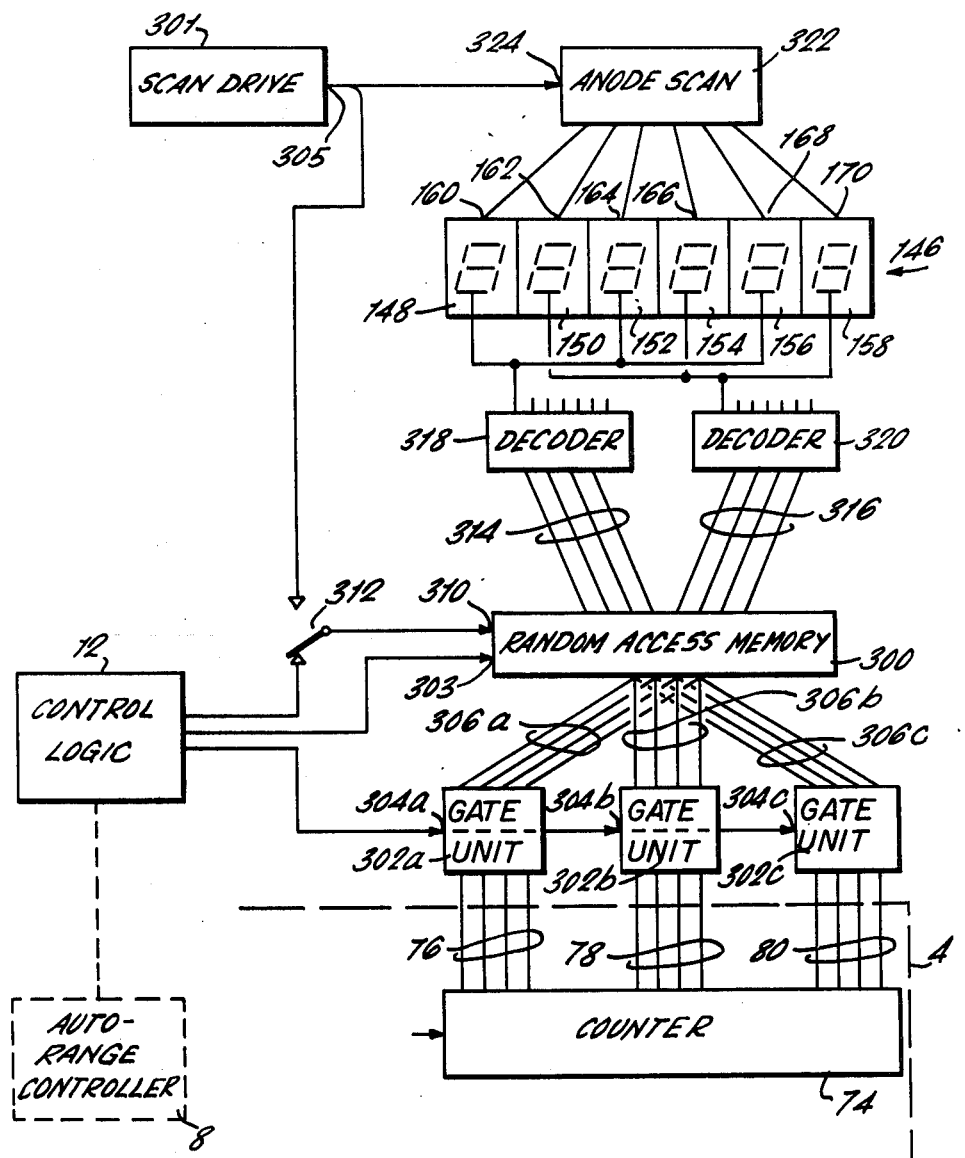

LONG SCALE DISPLAY

This invention relates to instruments for measuring and displaying digitally the magnitude of at least one parameter of an electrical input signal, e.g. the amplitude of a D.C. or A.C. input signal or the frequency of an A.C. input signal.

Typically such instruments are adapted to make measurements to four or five significant digits, this number being for example the output of an analogue to digital converter. In multi-range instruments the dynamic range of measurement capability is extended by prescaling, that is to say, by amplification or attenuation between the input signal and the analogue to digital converter so as to bring the magnitude of the signal presented to the analogue to digital converter within its correct operating range.

The prescaling may be by means of a manually operated switch or may be automatic, using for example the output of the analogue to digital converter to initiate a change of scale, a capability termed 'autoranging' in the art.

In either case the number of digits or decades in the display generally corresponds to the number of significant digits in the output of the analogue to digital converter and a separate indication is given to show the significance of each digit in the display. In the simplest case this indication may be provided by means of a legend on the escutcheon of a manually operated range switch or alternatively by automatic insertion, under the control of the prescaling means, of a decimal point plus an indication of range (e.g. "mV" or "V") in the case of an auto-ranging instrument.

However in either case the user must refer to the indication of range when reading the measurement. Where the instrument is auto-ranging there is the further disadvantage that each time the prescaling changes, the digits displayed jump left or right in the display. This is particularly tiresome for the user if the measured value is fluctuating in the operating region of the autorange circuits.

With the need in mind to alleviate these difficulties there is provided according to the invention an instrument for measuring and displaying digitally the magnitude of at least one parameter of an electrical input signal, which magnitude can lie in any one of M successive decade ranges, where M is an integer, the instrument comprising:

signal conversion means for receiving the input signal and converting it to a digital output signal which is representative of the magnitude of said parameter and has up to N significant figures, where N is an integer less than M, the signal conversion means including means for producing a range signal indicative of the range in which the magnitude of said parameter lies;

display means having at least M decades each of which represents a fixed order of magnitude of said parameter; and control means responsive to the range signal to direct the digital output signal to the respective group of up to N adjacent decades of the display means corresponding to the range in which the magnitude of said parameter lies, such that said display means displays the magnitude of said parameter.

Advantageously, the control means comprises means for sequentially energising only the individual decades of said respective group.

Alternatively, the control means may comprise storage means having a plurality of storage locations, each of which is adapted to co-operate with a respective one of the decades of the display means to display the digit stored in the said location, and storage control means for controlling the storage of the digital output signal of the signal conversion means in respective locations in dependence upon the range signal. In this case, the storage means may comprise a shift register and the storage control means is adapted to shift the contents of the shift register in dependence upon the range signal. Alternatively, the storage means may comprise a random access memory and the storage control means is adapted to modify the addresses of the respective locations in which the significant figures of the digital output signal are stored in dependence upon the range signal.

The invention will now be illustrated by way of non-limitative example only by reference to the accompanying drawings, of which:

FIG. 1 shows schematically an auto-ranging digital voltmeter according to one embodiment of the invention, FIG. 2 shows a display and legend for an auto-ranging multimeter according to the invention, FIG. 3 shows part of a digital voltmeter according to another embodiment of the invention, FIG. 4 shows part of a digital voltmeter according to a further embodiment of the invention.

The main elements of the DVM of FIG. 1 are an input pre-scaling unit 2, an analogue to digital converter 4, a display unit 6, an auto-ranging controller 8, a digital scaling unit 10 and control logic unit 12. For the sake of clarity detail connections between control logic unit 12 and the other units 2, 4, 6, 8 and 10 have been omitted from FIG. 1.

The input pre-scaling unit 2 comprises a HI input terminal 14 connected to an input 16 of a preamplifier 18 which has an output 20. The output 20 is connected through four series resistances, respectively 22, 24, 26 and 28, to ground. A LO input terminal 30 is connected to a common point 32 of four normally open relay contacts respectively 34, 36, 38 and 40. The other terminal of contact 34 is connected to the common point of resistances 22 and 24; that of contact 36 to the common point of resistances 24 and 26; that of contact 38 to the common point of resistances 26 and 28; and that of contact 40 to ground.

The output 20 of amplifier 18 is connected to input terminal 42 of the analogue to digital converter 4. Input terminal 42 is connected to one pole 44 of a two-position switch 46 which has a second pole 48 connected to a source of reference voltage 50. The armature 52 of switch 46 is connected via a resistor 54 to an input terminal 56 of an amplifier 58 which has an output 60 and a capacitor 62 connected between output 60 and input 56 so that it functions as an integrator. A clock pulse generator 63 is connected to supply clock pulses to an input 64 of an AND gate 66 which has a second input 68, connected to output 60 of amplifier 58, and an output 70. The output 70 of gate 66 is connected to an input 72 of a counter 74. The counter 74 is adapted to count up to 999 and to provide binary coded decimal (BCD) outputs representative of the number stored in the counter on three sets of BCD lines respectively designated 76 for the most significant, 78 intermediate significance and 80 least significant digits. Outputs representative of digits of the most significant decade are also available at an output 82 and of the intermediate decade at an output 84.

The auto-ranging controller 8 comprises a first digital comparator 86 connected to receive the output 82 of counter 74 and a second digital comparator 88 connected to receive the output 84 of counter 74. Digital comparators 86 and 88 have respective outputs 87 and 89 which are connected to respective inputs 90 and 92 of a shift register 94 which has an output 96 connected to an input 98 of a decode and relay drive unit 100. The relay drive unit 100 has five outputs, respectively 102 which is connected to operate a relay 110, 104 which is connected to operate a relay 112, 106 connected to operate relay 114 and 108 connected to operate a relay 116. A fifth output 118 provides a signal indicative of which relay is energised. Relay 110 when energised closes the relay contact 34; relay 112 closes contact 36, relay 114 closes contact 38 and relay 116 closes contact 40. These connections are represented by the dashed lines 110A, 112A, 114A and 116A, respectively.

The display 6 comprises a register 120 adapted to store a three digit decimal number which is connected to receive this number from the respective outputs 76, 78 and 80 of counter 74. Register 120 provides corresponding respective BCD outputs 122 in respect of the most significant digit, 124 in respect of the intermediate digit and 126 in respect of the least significant digit. Output 122 is connected to a set of four gates, not shown individually but designed collectively 128 which may be opened by a control signal from control logic unit 12; similarly, output 124 is connected to gates 130 and output 126 to gates 132. The corresponding bits at the output of each respective gate in sets 128, 130 and 132 are connected together at respective common connections 134, 136, 138 and 140. These common connections are respectively connected to the inputs of a decoder 142 which is adapted to receive a four-bit binary coded decimal input and to provide a seven-bit output 144 to drive a seven-segment display.

A display 146 comprises six decades arranged in denary relationship with one another, that is to say denoting successive powers of 10; the most significant is designated 148 and those of successively lesser significance 150, 152, 154, 156 and 158 respectively.

Each decade comprises a seven segment light emitting diode (LED) display.

The anodes (not shown) of each segment of decade 148 are connected together and brought out to a common terminal 160. Similarly the common anodes of decades 150 through 158 are brought out to common terminals 162 through 170 respectively.

Connections to the cathodes (not shown) of each segment of each decade are brought out individually; for example a connection to the cathode of the lowest horizontal stroke of decade 148 is made at 172, to the corresponding cathodes of decades 150 through 158 at 174 through 182 respectively. The cathode connections of corresponding segments in each decade are connected together to the appropriate bit in the output 144 of decoder 142. Thus connections 172 through 182 are connected together to a common bit in output 144. The individual anode terminals 160 through 170 are connected individually to outputs of a display anode scan unit 184 within the digital scaling unit 10. A range store 186 has an input 188 connected to output 118 of the decode and relay drive unit 100 in the auto-ranging controller 8, this connection serving to deliver a signal representative of a step of the input pre-scaling unit selected by operation of one of the relays 110 through 116. Range store 186 has an output 190 connected to the display anode scan unit 184 which is adapted to energise in turn three of the outputs selected by range store 186.

The operation of the instrument in making and displaying a measurement is as follows:

when the instrument is switched on the logic design is such that relay 116 is energised so that contact 40 is closed and the pre-scaling unit 2 is set to unity gain. The input signal to be measured is applied between the HI terminal 14 and the LO terminal 30 and appears at the input 42 of the analogue to digital converter 4. The analogue to digital converter operates on the dual ramp principle in which the input signal is applied to charge a capacitor during a fixed time and a reference voltage is used to discharge the capacitor, the time taken to discharge the capacitor being a measure of the amplitude of the input signal. Because the operation of dual ramp analogue to digital converters and the refinements thereon are well known, being described for example in our British Pat. No. 1,090,047, the following description is somewhat simplified. The fixed period during which the input signal at point 42 is applied by switch 46 to the integrator, which comprises input resistor 54, integrating amplifier 58 and capacitor 62, is conveniently determined by using clock pulse generator 63 in conjunction with counter 74. At the start of the measurement cycle switch 46 operates to connect armature 52 to the input signal so that the potential at the output 60 of the integrator starts to ramp away from its initial potential at a rate determined by the magnitude of the input signal. At the same time the gate 66 is opened to admit pulses from clock pulse generator 63 to counter 74. The clock frequency and counter capacity are arranged so that at the end of the predetermined time interval the counter reaches "full house" and a signal marking the transition is transmitted to the control unit 12. The control unit 12 then causes the switch 46 to change over thereby connecting the input 52 of the integrator to the source of reference voltage 50. It is arranged that the source of reference voltage 50 is of opposite polarity to the input voltage and the effect therefore is to discharge capacitor 62. When the potential at the output 60 of the integrator passes through the initial potential from which it started to ramp when the input signal was applied, the gate 66 is closed thereby stopping the count of clock pulses in counter 74. The time taken to discharge the capacitor and therefore the count in counter 74 at the end of the application of reference voltage 50 is therefore a measure of the input signal. The count in counter 74 may then be transferred via outputs 76, 78 and 80 to a register 120 thereby leaving the counter available to make another measurement cycle and facilitating the transfer of the count to the display.

If at the end of the measurement cycle the contents of the most significant decade of counter 74 exceed a predetermined number, the instrument is overloaded and circuits (not shown) are provided to warn the user. If on the other hand the value in the counter is less than a predetermined quantity then a change of range will be initiated so as to place the instrument in a more sensitive condition. This is accomplished by means of digital comparator 88 and shift register 94 which, if the number in counter 74 is less than a predetermined amount, provide an output signal at 96 to relay driver 100 which energises relay 114 and de-energises relay 116. This has the effect of closing contact 38 and opening contact 40 thereby introducing an amplification of 10 between the input signal between terminals 14 and 30 and the output signal between terminal 42 and ground. Accordingly another measurement cycle is initiated and this time the value accumulated in counter 74 representative of the input signal will be ten times greater. If this value still fails to operate the digital comparator 88 a further change or range will be initiated, de-energising relay 114 and energising relay 112 to close relay contact 36 and open relay contact 38 thus introduce an amplification factor of 100 in the pre-scaling unit 2.

Similarly, if when the instrument is in other than its least sensitive range, with relay 116 energised, an input voltage is applied the effect of which is to indicate an overload as described above, digital comparator 86 will provide an output at 87 to shift the shift register 94 in a condition such that the output of relay driver 100 de-energises, for example, relay 112 and energises relay 114 thereby resetting the pre-scaling unit 2 to a lower amplification.

The output 118 of the relay driver 110 thus indicates the amplification introduced by the pre-scaling unit whether this is a factor of one, ten, one hundred or one thousand.

When a measurement has been made such that the count in counter 74 neither indicates an overload nor an underrange condition, the display cycle will be initiated by control unit 12. The first step is to transfer the number stored in counter 74 to register 120 by opening gates (not shown). The gates 128, 130 and 132 allow the successive decimal numbers, stored as BCD in register 120, to be presented successively to the decoder 142. The outputs 144 of decoder 142 are connected respectively to the cathodes of the same segments of each of the seven segment cage displays 148 through 158. On the other hand, the common anodes of all the segments in each of the decades are brought out separately so that the numeral to be displayed at any instant is selected by the outputs from decoder 142 but the decade in which it is displayed is selected by the output from anode scan unit 184. The anode scan unit is arranged to provide a connection successively to three of the anodes, the selection of three anodes being dictated by the number hold in range store 186. Thus on the most sensitive range the anode scan unit will successively connect anodes 170, 168 and 166 whilst at the same time the control unit opens successively gates 132, 130 and 128. The scanning of the display in this way is cyclic and at such a repetition rate as to be unnoticed by the eye of the user. If on the other hand, the magnitude of the input signal is such that the auto-ranging unit has switched the instrument into its least sensitive state, an output signal at 118 indicative thereof will modify the content range store 186 so that the anode scan outputs from anode scan unit 184 successively close connections 164, 162 and 160 whilst the corresponding respective gates 132, 130 and 128 are presenting the least significant, intermediate significance and most significant digits to the decoder 142. The measured value will then appear in the decades 148, 150 and 152.

It will be appreciated therefore that the co-operation of the digital scaling unit 10 with the auto-ranging unit 8 and pre-scaling unit 2 is such as to place the measured value automatically into decades of the display each of which has a predetermined order of magnitude. Conveniently, a legend may be provided with the display to indicate the significance of each decade and FIG. 2 illustrates such a legend 232 used with an auto-ranging multimeter according to FIG. 1.

As in FIG. 1 a six decade display 146 is used with a 3-digit ADC. It is assumed that the ADC 4 has a full scale of 999 in response to an input signal of 9.99 volts and that the prescaling unit 2 provides amplification of 1, 10, 100 or 1000. The most sensitive range is therefore 9.99 mV. FIG. 2 shows a display of 72.3 mV i.e. with a gain in prescaling unit 2 of 100.

Provision is also made, in known manner, for the meter to be arranged to measure current and resistance as well as voltage, the function being selected by a function selector switch 230. For example, on current ranges the voltage prescaling unit 2 would be supplemented by a current prescaling unit adapted to select and present between the input terminals a resistance appropriate to the current measured whilst retaining the maximum gain of the voltage prescaling unit 2. Thus a current prescaling unit would present an input resistance of 1.0 ohms when measuring a current of 7.23mA so as to present a voltage of 7.23 mV at the input of prescaling unit 2 which is set, on all current ranges, to its maximum gain of 1000.

Similarly, when measuring resistance, a resistance prescaling unit would supplement the voltage prescaling unit 2 by providing for a current to be passed through the resistance, the voltage developed across the resistor being applied to the input of prescaling unit 2; the magnitude of the current would be varied in denary steps, to produce a voltage within the range of the ADC 4 with the prescaler 2 at maximum gain e.g. 1μA into a resistance of 7230 ohms to produce a voltage of 7.23 mV.

It will be appreciated that the invention lends itself to a number of alternative embodiments including by way of further example that of FIG. 3 where a shift register is used to store and align the output of the analogue to digital converter 4 with the decades of display 146 appropriate to the range in use, other elements of the DVM of which FIG. 3 forms part being as shown in FIG. 1.

In FIG. 3 a digital scaling unit 200 comprises a 24-bit shift register store 202 which affords storage locations for six four-bit words corresponding to the six decades of display 146 and which has an input 204 for receiving a succession of bits loaded serially, outputs from each of the 24 stages designated collectively 206, and a control terminal 208. A signal at the control terminal 208 allows the contents of the register to be shifted to the right, i.e. away from the input. Control terminal 208 is connected to an output 224 of a storage controller 226 which has an input 228 connected to the output 118 of relay drive unit 100 (shown in FIG. 1).

The outputs 206 of shift register 202 are connected to corresponding respective inputs of six decoder drivers 210a to 210f respectively. Each decoder driver 210 has four inputs 212 and seven outputs 214 for driving a seven-segment display to show the numeral corresponding to a BCD input applied to its input terminals 212. Each respective output 214 is connected to the respective inputs 172 of display 146 so that the number stored in shift register 202 may be displayed on display 146.

A shift register 216 has inputs connected to the respective outputs 122, 124 and 126, of counter 74, an output 220 connected to the input 204 of shift register 202 and a control terminal 222. Control terminal 222 is connected to receive signals from the central logic unit 12.

The action of a DVM incorporating the embodiment of FIG. 2 follows that described above in respect of FIG. 1 up to the point where a count representative of the magnitude of the input signal has been accumulated in counter 74 during a digitising interval.

At the end of the measurement cycle the number in counter 74 is transferred in parallel by means of gates (not shown) to shift register 216. The number is then transferred serially from shift register 216 to shift register 202 by a control signal from the control logic unit 12. When the transfer is complete the number will be held in those bits of shift register 202 which correspond to the three most significant decades of display 146 and are connected thereto by decoder/drivers 210a to 210c inclusive.

The function of controller 226 is to store the range setting representative of the amplification introduced by pre-scaling unit 2, which is received by shift controller 228 from relay driver 100, and to shift the number in shift register 202 down the shift register by a corresponding amount so as to reduce its significance when displayed on display 146.

Thus if at the end of the measurement cycle, the relay 112 were energised to close relay contact 36 so that a gain of 100 was introduced between the input terminals 14, 30, and the input 42 to the ADC, the controller 226 would shift the number in shift register 202 by two decades, i.e. by eight bits. The number would then be stored in shift register 202 so as to be displayed by decades 152, 154 and 156.

Here again co-operation between the digital scaling unit 200 and the auto-ranging unit 8 and pre-scaling unit 2 places the measured value from ADC 4 automatically into decades of display 146 which have the appropriate and predetermined significance.

FIG. 4 illustrates a further embodiment of the invention in which a random access memory RAM 300 is used to store the output of the ADC 4. RAM 300 can store six four-bit words, each word corresponding to one of the decades 148 to 158 of a display unit 146. The memory locations into which the contents of counter 74 are transferred are governed by the setting of the prescaler 2 so that when the contents of the memory are read out systematically under the control of a scan drive unit 301, the decades in which the output of ADC 4 appear is dictated by the prescaler unit 8.

The respective BCD outputs 76, 78 and 80 of counter 74 are connected to respective inputs of gate units 302a, 302b and 302c which have respective control inputs 304a, 304b and 304c connected to receive signals from the control logic unit 12. Gate units 302a, 302b and 302c also have respective outputs 306a, 306b and 306c connected together at a write input of RAM 300.

RAM 300 may operate in a 'write' mode to store four-bit words appearing at its input or in a 'read' mode in which it presents the contents of a selected address on one or other of respective four-bit outputs 314 and 316. RAM 300 has an input 303 connected to logic unit 12 which when 'up' places RAM 300 in 'read mode' and when 'down' places it in its 'write' mode. The address to be written in or read out is selected by a signal at an input 310 of RAM 300, and input 310 is connected by a switch depicted symbolically as 312 to either logic unit 12 or to scan drive unit 302. Decoder 318 is connected, as described above with reference to FIG. 1, to the cathodes of decades 148, 152 and 156 of display 146; decoder 320 is connected to respective decades 150, 154 and 158.

The anodes, not shown, of each segment of decade 148 are connected together and brought out to a common terminal 160, and the common anodes of decades 150 through 158 are brought out to common terminals 162 through 170 respectively as in FIG. 1. The common anode terminals 160 through 170 are connected individually to the outputs of a display anode scan unit 322 which has an input 324 connected to an output 305 of scan drive unit 301.

The operation of the circuit of FIG. 4 is as follows: at the end of the digitising cycle of ADC 4, a signal from logic unit 12 at input 303 switches RAM 300 into its write mode and at the same time switch 312 is operated to connect input 310 to the logic unit 12.

The sequence of output signals presented from logic unit 12 to input 310, which determine the locations in which the contents of counter 74 are to be stored, is determined by a signal from the prescaler unit 8 representative of the selected step therein.

As each of the three addresses are successively presented to input 310, signals at respective inputs 304a, 304b and 304c successively present BCD signals on outputs 74, 78 and 80 to the input of RAM 300 thereby causing the contents of the counter to be read into RAM 300.

When this transfer is complete, RAM 300 is switched back into the read mode by signal from logic unit 12 and input 303 reverting to 'down' and at the same time its address input 310 is connected via switch 312 to the output of scan drive unit 301.

Scan drive unit 301 presents at its output 305 a succession of addresses which cause anode scan unit 322 successively to energise common anode terminals 160 through 170 at the same time as the contents of successive corresponding addresses of RAM 300 are read out via decoders 318 and 320. RAM 300 is arranged to present outputs of consecutive addresses alternately on respective outputs 314 and 316 so as to enhance the apparent brightness of display 146.

It will be appreciated that in this embodiment the gate units 302a, 302b and 302c and RAM 300 together constitute digital scaling means corresponding to that designated 10 in FIG. 1 and 200 in FIG. 3. In this embodiment the anode scan unit 322 scans continuously through all the common anode terminals 160 – 170 and selection of decades in which the output of ADC 4 is to be displayed is made when the RAM 300 is loaded.

It will also be appreciated that RAM 300 may usefully be employed to store other information which is to be displayed such as leading zeros or a travelling minus sign in respect of negative readings. This would be loaded into the memory immediately before or after the contents of the counter 74.

Although the invention has been described in relation to an instrument employing an analogue-to-digital converter arranged to operate as a digital voltmeter, it is equally applicable to other instruments, for example frequency meters. In this case, the signal conversion means comprises a counter/timer whose gate or counting time is variable in decade steps.

What is claimed is:

1. An instrument for measuring and displaying digitally the magnitude of at least one parameter of an electrical input signal, which magnitude can lie in any one of M successive decade ranges, where M is an integer, the instrument comprising:

signal conversion means for receiving the input signal and converting it to a digital output signal which is representative of the magnitude of said parameter and has up to N significant figures, where N is an integer less than M, the signal conversion means including scaling means operative to maintain said digital output signal within a predetermined range, and means coordinated with said scaling means for producing a range signal indicative of the range in which the magnitude of said parameter lies;

display means having at least M decades each of which represents a fixed order of magnitude of said parameter; and control means responsive to the range signal to direct the digital output signal to the respective group of up to N adjacent decades of the display means corresponding to the range in which the magnitude of said parameter lies, such that said display means displays the magnitude of said parameter.

2. An instrument as claimed in claim 1, wherein the control means comprises means for sequentially energising only the individual decades of said respective group.

3. An instrument as claimed in claim 1, wherein the control means comprises storage means having a plurality of storage locations, each of which is adapted to co-operate with a respective one of the decades of the display means to display the digit stored in the said location, and storage control means for controlling the storage of the digital output signal of the signal conversion means in respective locations in dependence upon the range signal.

4. An instrument as claimed in claim 3, wherein the storage means comprises a shift register and the storage control means is adapted to shift the contents of the shift register in dependence upon the range signal.

5. An instrument as claimed in claim 3, wherein the storage means comprises a random access memory and the storage control means is adapted to modify the addresses of the respective locations in which the significant figures of the digital output signal are stored in dependence upon the range signal.

6. An instrument as claimed in claim 1 wherein said scaling means is arranged to receive and scale the input signal.

7. An instrument as claimed in claim 6, for measuring the amplitude of an electrical signal, wherein said input scaling means includes means for receiving and scaling the input signal to produce a scaled signal whose amplitude is in denary relationship with the amplitude of the input signal and lies in a predetermined range, and an analogue-to-digital converter connected to receive and convert the scaled signal to produce said digital output signal.

* * * * *